(12) United States Patent
Jung

(10) Patent No.: US 6,484,110 B1
(45) Date of Patent: Nov. 19, 2002

(54) METHOD FOR DISPLAYING AVAILABLE TIME OF BATTERY IN MOBILE STATION

(75) Inventor: Sang Il Jung, Kyonggi-do (KR)

(73) Assignee: LG Information & Communications, Ltd, Seoul (KR)

( * ) Notice: Subject to any disclaimer, the term of this patent is extended or adjusted under 35 U.S.C. 154(b) by 118 days.

(21) Appl. No.: 09/593,504

(22) Filed: Jun. 14, 2000

(30) Foreign Application Priority Data

Jun. 15, 1999 (KR) ............................................ 99-22364

(51) Int. Cl.$^7$ ................................................ G01R 31/36
(52) U.S. Cl. .......................................... 702/63; 702/64
(58) Field of Search ............................. 702/60, 61, 63, 702/64, 65, 67, 52, 57, 182, 183; 320/134, 133, 128, 136; 455/573, 127, 343, 435

(56) References Cited

U.S. PATENT DOCUMENTS 5,248,929 A * 9/1993 Burke ........................... 320/48
5,838,139 A * 11/1998 Greene ......................... 320/133
6,313,832 B1 * 11/2001 Ishida ........................... 345/211

* cited by examiner

*Primary Examiner*—Marc S. Hoff
*Assistant Examiner*—Marc Cooley
(74) *Attorney, Agent, or Firm*—Fleshner & Kim, LLP

(57) ABSTRACT

Method for displaying an available time according to battery capacity in a mobile station, including the steps of (1) forming relations between current consumption(mA) of the mobile station both in a standby mode and a call mode and a strength of a received signal into tables, and storing the tables in a memory respectively, (2) measuring a battery voltage for calculating a remained amount of battery capacity(mAh), (3) measuring a strength of a received signal, and reading current consumption(mA) both in the standby mode and in the call mode corresponding to the measured strength of the received signal, (4) dividing the remained amount of the battery capacity(Mah) by respective current consumption to calculate an available standby time and an available call time, and (5) displaying the available standby time and/or the available call time, whereby enhancing an efficiency of use of the mobile station because available time of use of the mobile station can be known with easy, and a time when the battery should be charged can be informed by vision.

18 Claims, 4 Drawing Sheets

METHOD FOR DISPLAYING AVAILABLE TIME OF BATTERY IN MOBILE STATION

BACKGROUND OF THE INVENTION

1. Field of the Invention

The present invention relates to a mobile station, and more particularly, to a method for displaying an available time according to battery capacity in a mobile station, in which both an available standby time and an available call time of a mobile station are displayed according to a remained amount in a battery capacity.

2. Background of the Related Art

In general, the mobile station provides a variety of services, such as displaying a time period to be charged and a real time, memorizing, signal transmission/reception selection, and the like. FIG. 1 illustrates a block diagram showing a system of a related art mobile station.

Referring to FIG. 1, the related art mobile station is provided with an antenna 110 for transmission/reception of a radio signal, a duplexer 120 for combining the transmission/reception of the radio signals through the antenna 110 to permit communication even by using only one antenna, a receiver 140 for converting a frequency of the radio signal received through the antenna 110 into a Intermediate frequency(IF), a transmitter 130 for converting frequencies of various signals processed for transmission for transmission through the antenna 110 into Radio frequencies (RF), and providing to the duplexer 120, a high power detector 150 for detecting an output power of the transmitter 130, a battery 160 for supplying an operation power to the mobile station, a memory(RAM) 200 for storing various information required for processing external data, a baseband part for converting outputs of the high power detector 150, the receiver 140 and the battery 160 in digital signals, or converting a signal to be provided to the transmitter 130 into an analog signal, an MSM(Mobile Station Modem) 180 for controlling the transmission/reception of the radio signal of the mobile station, and a user interface 190 having a keypad, a liquid crystal display, a speaker, and a microphone for a user to select a mode or permit input/output the radio signal. The baseband part 170 has a digital/analog converter 171 for converting the digital signal form the MSM 180 into an analog signal and providing to the transmitter 130, a first analog/digital convertor 172 for converting the analog signal from the receiver 140 into a digital signal and providing to the MSM 180, and a second analog/digital convertor 173 for converting outputs of the high power detector 150, the receiver 140 and the battery 160 into digital signals and providing to the MSM 180. The MSM 180 has a demodulator 183 for demodulating a signal from the first analog/digital convertor 172 into a CDMA digital signal, a microprocessor 182 for receiving a signal from the second analog/digital convertor 173 and a key signal from the user interface 190 and providing a control signal corresponding to the received signals, a modulator 181 for modulating a data to be transmitted, and a vocoder 184 for converting the signal demodulated at the demodulator 183 into a speech signal, and converting the signal to be transmitted into a CDMA digital signal and providing to the modulator 181. The user interface 190 has an LCD window 194 for displaying various data for the user, a microphone 192 for converting a speech of the user into an electrical signal, a speaker 193 for receiving and converting various electrical signals into vibration to convert the electrical signals into audible signals, a keypad 195 having a plurality of buttons for the user to input various data in using the mobile station, and a CODEC 191 for converting the digital speech signal from the vocoder 184 into an analog speech signal and presenting to the speaker 193, and converting an analog speech signal from the microphone 192 into a digital speech signal and providing to the vocoder 184.

The signal transmission/reception operation of the related art mobile station will be explained. A CDMA signal received through the antenna 110 undergoes a frequency conversion into a intermediate frequency(IF) at the receiver 140. The analog signal is converted into a digital signal at the first analog/digital convertor 172 in the base band part 170. The analog/digital convertor 172 is used for conversion of a voice data. The digital signal from the first analog/digital convertor 172 is demodulated into a CDMA digital signal at the demodulator 183 in the MSM 180, and converted into a digital voice signal at the vocoder 184. Once the digital signal is converted into an analog signal at the CODEC 191 in the user interface 190, and forwarded to the speaker 193, the voice can be heard. In the case of transmission, the analog voice signal received at the microphone 192 is converted into a digital voice signal at the audio CODEC 191, into a CDMA digital signal at the vocoder 184 in the MSM 180, and into a digital signal at the modulator 182. The digital signal, then, is converted into an analog signal at the digital/analog convertor 171 in the baseband part 170, and frequency up-converted at the transmitter 130, and transmitted to a base station through the duplexer 120 and the antenna 110.

Related art methods for displaying a strength of incoming signal and an available battery capacity in the aforementioned mobile station will be explained. FIG. 2 illustrates a graph showing a battery discharge characteristic in a mobile station. In general, a lithium-ion battery is used for the mobile station. The battery is rechargeable, can provide approx. 4.2V when the battery is charged fully, and has a built-in protection circuit for blocking anymore use of the battery when the battery can only provide 2.7V due to prolonged use of the battery. That is, since 2.7V is preset as a cut off voltage by a mobile station vender, the mobile station becomes inoperative when the battery voltage is at 2.7V. FIG. 3 illustrates a flow chart for explaining a related art method for displaying a strength of incoming signal and a method for displaying remained battery capacity in a related art mobile station.

Referring to FIG. 3, a radio signal from a base station is received at an antenna S21, passes through the antenna 110 and the duplexer 120, and undergoes frequency up-converting at a receiver 140 S22. The signal is then converted into a digital signal at the second analog/digital convertor 173 S23. The second analog/digital convertor is used for a conventional input/output data. The strength of a signal received through the antenna and a battery voltage are read at a microprocessor 181 in an MSM 180 S24. Then, the strength of the received signal and the remained amount of battery charge are displayed S25. The remained amount of battery charge is displayed, with a range of voltage between 4.2V at the time of full charge and the 2.7V at the time of cut off divided equally into three to five. That is, when the remained amount of battery charge is divided into four, four pieces are displayed when the battery output voltage is 3.6V~4.2V, three pieces are displayed when the battery output voltage is 3.2V~3.6V, two pieces when the battery output voltage is 3.0V~3.2V, one piece when the battery output voltage is 2.7V~3.0V. Thus, the aforementioned related art mobile station digitizes the strength of a received signal and the remained amount of battery charge and displays on an LCD for informing to the user.

However, the related art method for displaying the remained amount of battery capacity has the following problems.

First, when the mobile station is turned on, a charge in the battery is consumed continuously from the time of turn on, and particularly, a rate of the consumption is greater during call than standby. As the remained amount of battery capacity is displayed, merely with the remained amount of battery capacity divided three to five in the related art method for displaying an available time period of the battery, the user can not see an available standby time and available call time for the remained amount of battery capacity, precisely. Consequently, there may be occasions when the user fails to complete an important call due to the battery discharge when a hurried, or unexpected call is required.

Second, even if the rate of charge consumption varies with the strength of reception/transmission signal (sensitivity), the available standby time and the available call time could not have been displayed because the variation has not been taken into account in calculation of the available time, causing the above failure occurred.

SUMMARY OF THE INVENTION

Accordingly, the present invention is directed to a method for displaying an available time according to battery capacity in a mobile station that substantially obviates one or more of the problems due to limitations and disadvantages of the related art.

An object of the present invention is to provide a method for displaying an available time according to battery capacity in a mobile station, which can inform an available standby time and an available call time of the mobile station to a user, and calculate a more accurate remained amount of battery capacity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for displaying an available time according to battery capacity in a mobile station, includes the steps of (1) calculating an available standby time and an available call time according to battery capacity, and (2) informing the calculated available standby time and/or the available call time by numerals or voice.

In other aspect of the present invention, there is provided a method for displaying an available time according to battery capacity in a mobile station, including the steps of (1) forming relations between current consumption(mA) of the mobile station both in a standby mode and a call mode and a strength of a received signal into tables, and storing the tables in a memory respectively, (2) measuring a battery voltage for calculating a remained amount of battery capacity(mAh), (3) measuring a strength of a received signal, and reading current consumption both in the standby mode and in the call mode corresponding to the measured strength of the received signal, (4) dividing the remained amount of the battery capacity(mAh) by respective current consumption(mA) to calculate an available standby time and an available call time, and (5) displaying the available standby time and/or the available call time.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 4:
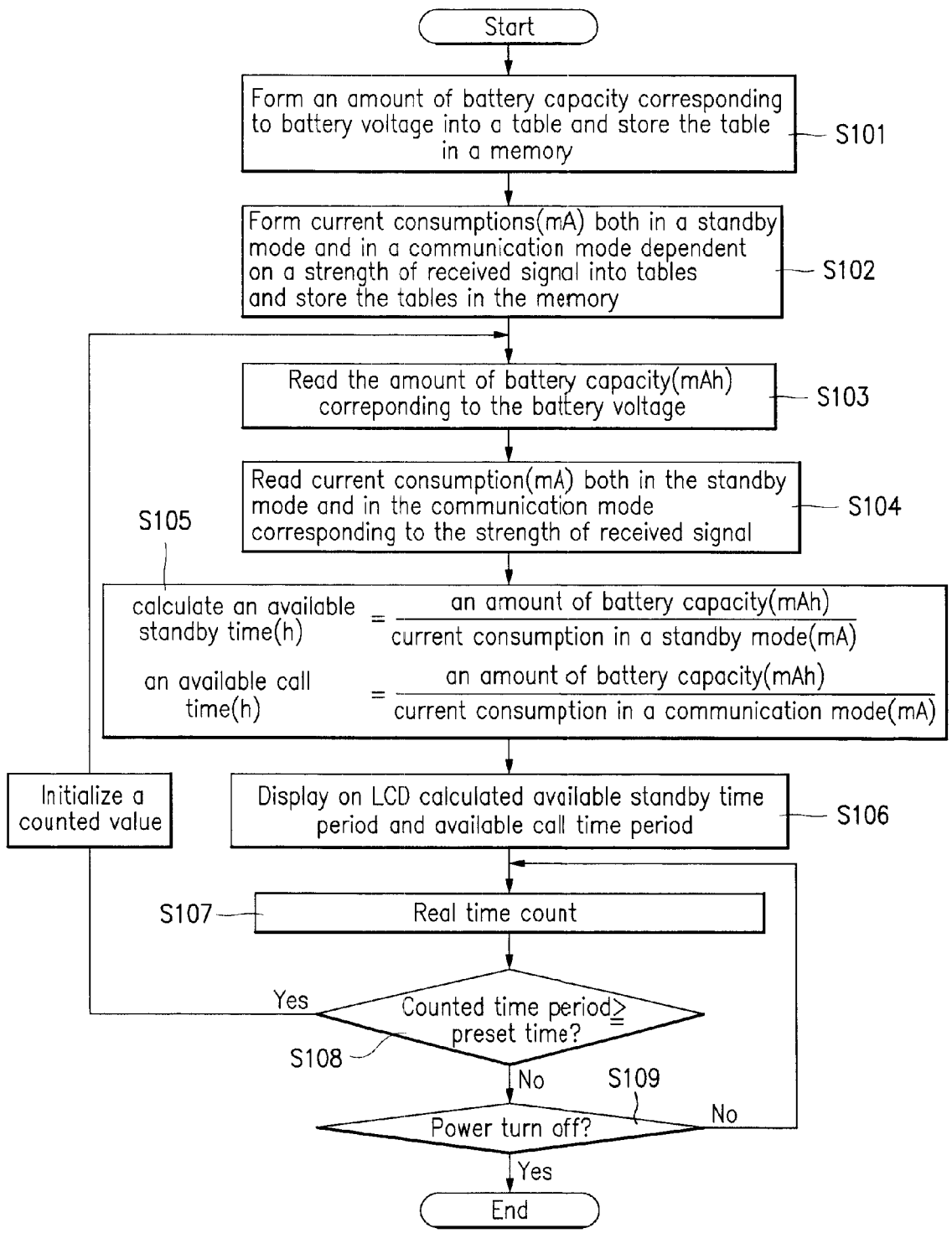

Reference will now be made in detail to the preferred embodiments of the present invention, examples of which are illustrated in the accompanying drawings. FIG. 4 illustrates a flow chart for explaining a method for displaying an available standby time and an available call time according to a battery capacity in accordance with a preferred embodiment of the present invention.

Figure 1:
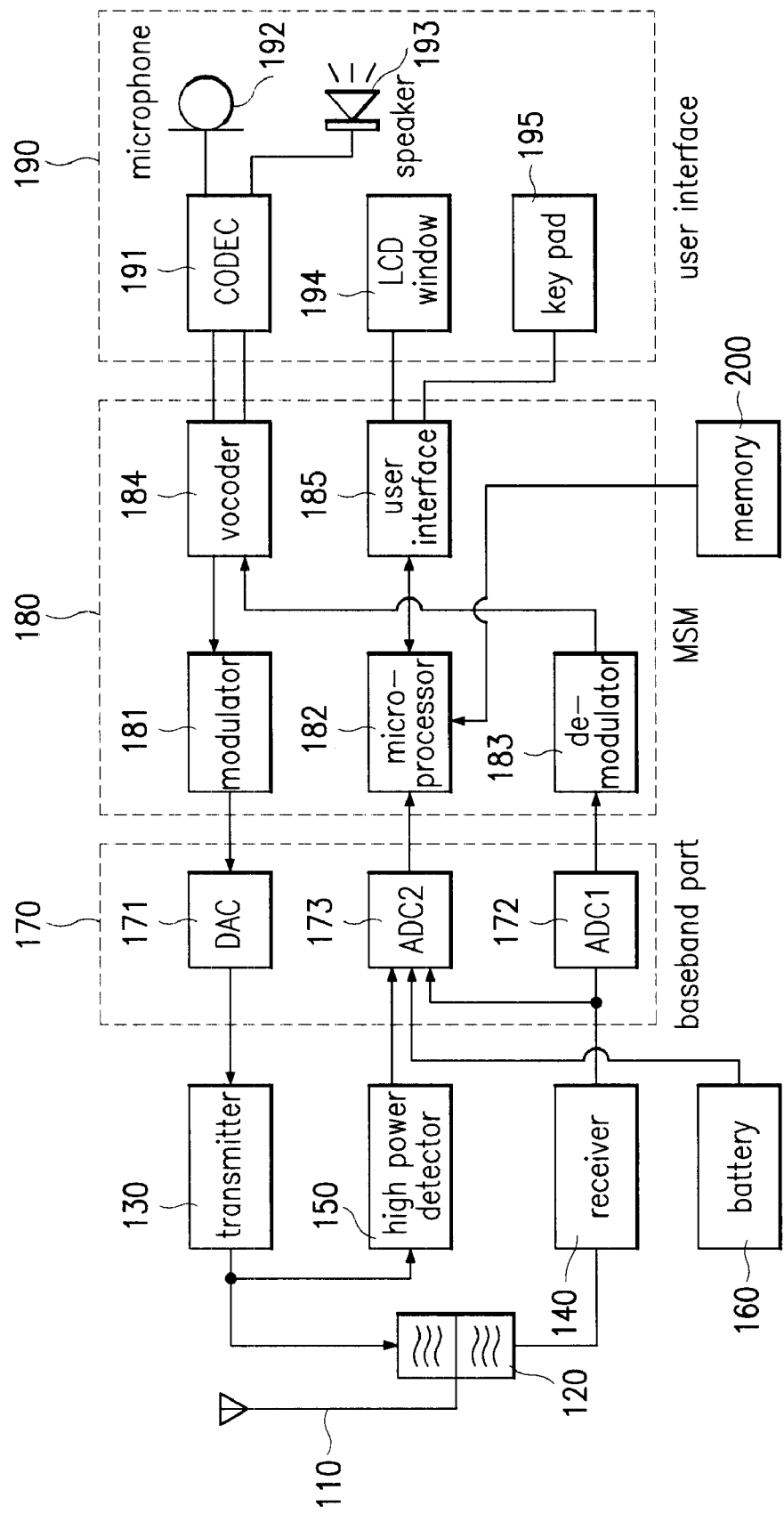
FIG. 1 illustrates a block diagram showing a system of a related art mobile station.
Figure 2:
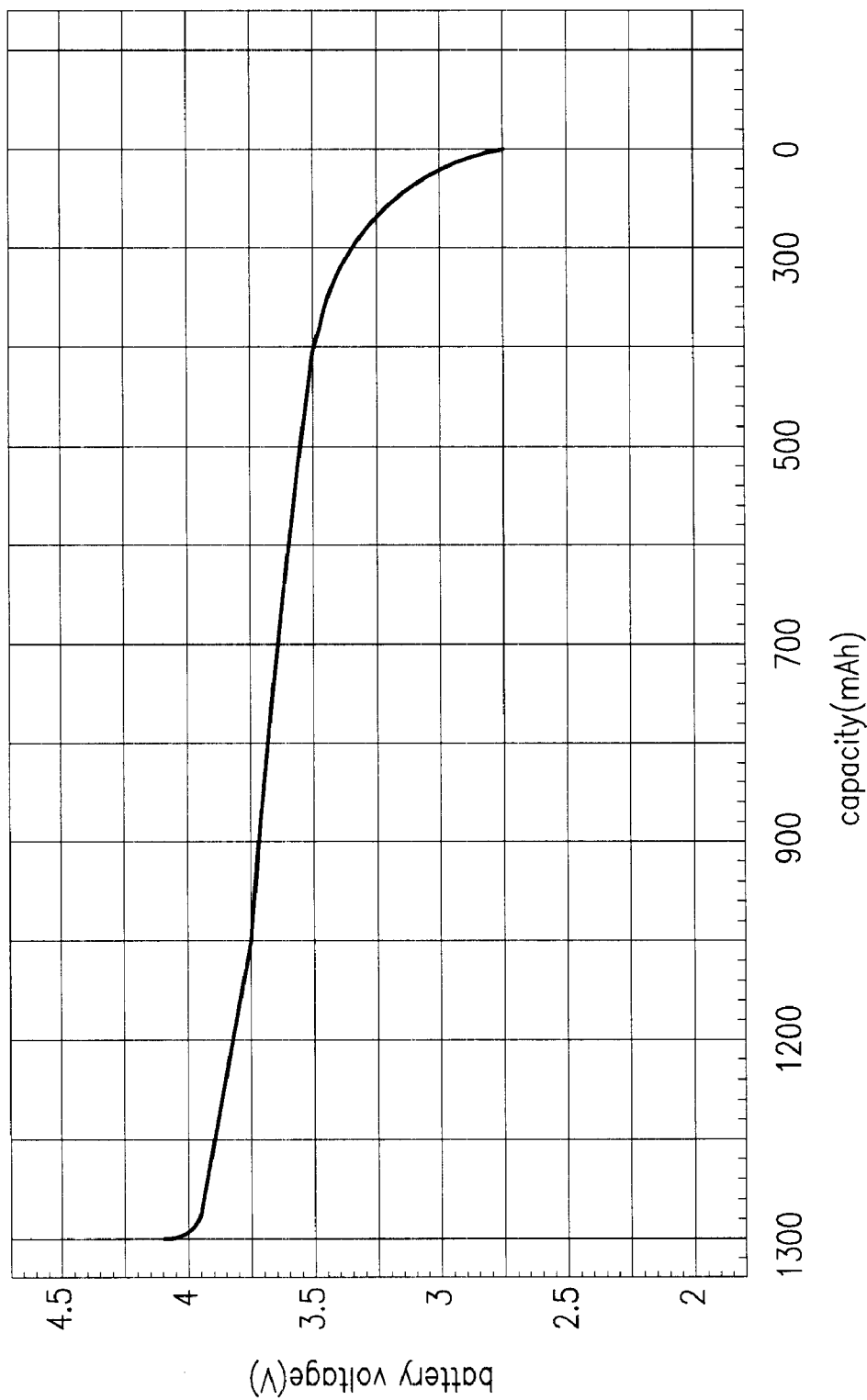
FIG. 2 illustrates a graph showing a battery capacity characteristic.
Figure 3:
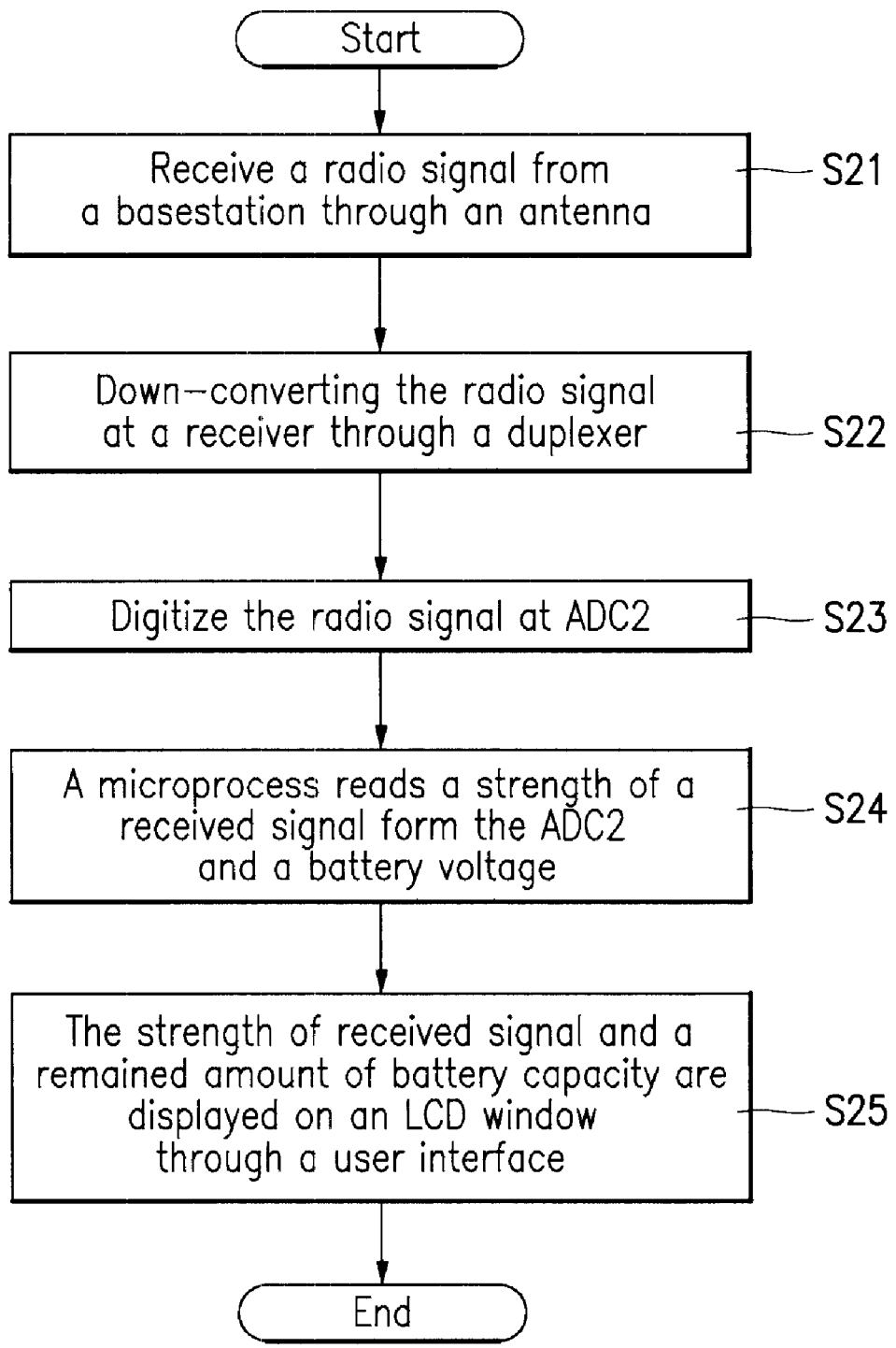
FIG. 3 illustrates a flow chart for explaining a related art method for displaying a strength of incoming signal and a method for displaying remained battery capacity in a battery in a related art mobile station; and, FIG. 4 illustrates a flow chart for explaining the operation of displaying an available standby time period and an available call time period according to a battery capacity in accordance with a preferred embodiment of the present invention.

Referring to FIG. 2, a relation of amounts of battery capacity versus voltages of a battery is provided as a table, and stored in a memory 200 S101. Current consumption of the mobile station in a standby mode and current consumption of the mobile station in a call mode, both dependent on a received signal, are formed into tables by sampling tests, and stored in the memory 200 S102. That is, amounts of battery capacity for fixed increments of voltage obtained by dividing a range of voltage starting from the cut off voltage to a voltage at full charge of the battery are formed into a table and stored in a memory, and amounts of current consumption for fixed increments of received signal strength for standby mode and call mode are formed into tables and stored in the memory, respectively. A voltage from the battery 160 is measured by the microprocessor 181 through the second analog/digital convertor, and the amount of a battery capacity corresponding to the measured voltage is read from the memory 200 S103. And, the microprocessor 182 receives a signal from the base station through the antenna 110, the duplexer 120, the receiver 140, the second analog/digital convertor 173, and measures a strength of the signal. Current consumption for both the standby mode and the call mode corresponding to the measured received signal strength are read from the memory 200 S104. Then, the microprocessor 182 calculates an available standby time and an available call time by using the read amount of battery capacity(mAh) and current consumption(mA) in the standby mode and current consumption(mA) in the call mode S105. That is, the available standby time is obtained by dividing the amount of battery capacity by the current consumption (mA) in the standby mode, and the available call time is obtained by dividing the amount of battery capacity(mAh)

by the current consumption(mA) in the call mode. The available standby time and the available call time obtained thus are displayed on the LCD window 194 S106, and counts a time period S107. When the counted time period is equal to a preset time period, the above steps(S103~S109) are repeated, to calculate and display new available standby time and available call time corresponding to the remained amount of battery capacity S108. The above steps are repeated until power is turned off S109.

Methods for displaying an available standby time and an available call time will be explained.

First, the available standby time and available call time are displayed on the LCD window 194 on the same time.

Second, the available standby time and available call time are displayed on the LCD window 194, alternatively.

Third, while only the available standby time is displayed on the LCD window 194 when the mobile station is in a folded state, not the available standby time, but the available call time, is displayed if the mobile station is unfolded, or received a key signal.

Fourth, while only the available standby time is displayed on the LCD window 194 when the mobile station is in a folded state, the available call time is informed by a voice if the mobile station is unfolded, or received a key signal. That is, the available call time is informed by the voice at a time point a connection sound ends when the user transmits a call signal, or both the available standby time and available call time may be informed. In order to inform the available time by voice, a voice IC should be provided in the mobile station, additionally.

As has been explained, the method for displaying an available time according to battery capacity in a mobile station of the present invention has the following advantages.

The informing of the available time according to battery capacity, i.e., the available standby time and available call time, by displaying on an LCD window of by voice permits the user to know an accurate available time of the mobile station with easy, and a time point to start charge of the battery of the mobile station by vision and hearing, thereby enhancing effectiveness of the mobile station.

It will be apparent to those skilled in the art that various modifications and variations can be made in of the present invention without departing from the spirit or scope of the invention. Thus, it is intended that the present invention cover the modifications and variations of this invention provided they come within the scope of the appended claims and their equivalents.

What is claimed is:

1. A method for determining an available time according to battery capacity in a mobile station, comprising:
    measuring a strength of a received signal;
    forming a first table setting forth relationships between current consumption of the mobile station in at least one of a standby mode or a call mode and the strength of the received signal by means of sampling tests;
    storing the first table in the memory;
    reading current consumption from the first table both in standby mode and in call mode corresponding to the measured strength of the received signal; and
    calculating at least one of an available standby time or an available call time for a remaining amount of battery capacity based on the current consumption both in standby mode and in call mode corresponding to the measured strength of the received signal.

2. A method as claimed in claim 1, further comprising conveying information about the calculated available standby time and/or available call time using a visual or audio transmission.

3. A method as claimed in claim 1, wherein calculating the available standby and/or call time for the remaining amount of battery capacity comprises:
    forming a second table setting forth relationships between amounts of battery capacity (mAh) and battery voltages (V) for a battery;
    storing the second table in a memory;
    measuring the battery voltage;
    reading the battery capacity corresponding to the measured battery voltage from the second table; and
    calculating at least one of the available standby time or the available call time by using the read amount of battery capacity (mAh) and the read current consumption (mA) in at least one of the standby mode or the call mode.

4. A method as claimed in claim 2, wherein the conveying the calculated time(s) comprises displaying the available standby time and the available call time at the same time.

5. A method as claimed in claim 2, wherein the conveying the calculated time(s) comprises displaying the available standby time and the available call time, alternatively.

6. A method as claimed in claim 2, wherein the conveying the calculated time(s) comprises displaying the available standby time only in a general mode, and displaying the available call time if the mobile station is activated, unfolded or a key signal is received.

7. A method as claimed in claim 2, wherein conveying the calculated time(s) comprises displaying the available standby time on an LCD window, and informing the available call time by voice.

8. A method as claimed in claim 7, wherein the available call time is informed by voice after a connection sound.

9. A method for determining an available time according to battery capacity in a mobile station, comprising:
    forming a table setting forth relationships between current consumption (mA) of the mobile station in at least one of a standby mode and a call mode and a strength of a received signal;
    storing the table in a memory;
    measuring a battery voltage (V) for calculating a remaining amount of battery capacity (mAh);
    measuring a strength of a received signal;
    reading current consumption (mA) from the table in at least one of the standby mode and the call mode corresponding to the measured strength of the received signal;
    dividing the remaining amount of the battery capacity (mAh) by the read current consumption (mA) to calculate an available standby time and/or an available call time; and
    displaying the available standby time and/or the available call time.

10. A method as claimed in claim 9, further comprising determining the available standby and/or call time according to battery capacity at fixed intervals.

11. A method as claimed in claim 9, wherein the available standby time and the available call time are displayed on the LCD window.

12. A method as claimed in claim 9, wherein the available standby time and the available call time are displayed, alternatively.

13. A method as claimed in claim 9, wherein the available standby time only is displayed in a general mode, and the available call time is displayed instead of the available standby time if the mobile station is activated, unfolded or a key signal is received.

14. A method as claimed in claim 9, wherein the available standby time is displayed on an LCD window, and the available call time is informed by voice.

15. A method as claimed in claim 14, wherein the available call time is informed by voice after a connection sound.

16. A method for determining a remaining battery capacity time in a mobile station, comprising:

forming a table corresponding to current consumption of the mobile station based on a strength of a received signal;

measuring the strength of the received signal;

reading current consumption from the table based on the measured strength of the received signal; and calculating the remaining battery capacity time based on the current consumption and a measured voltage of the battery.

17. The method as claimed in claim 16, further comprising conveying the remaining battery capacity time using a visual or audio transmission.

18. The method as claimed in claim 16, wherein the current consumption is based on the mobile station in standby and/or call mode, and wherein the remaining battery capacity time is calculated for the standby and/or call mode(s).

* * * * *